(12) United States Patent
Gillis et al.

(10) Patent No.: US 7,281,182 B2
(45) Date of Patent: Oct. 9, 2007

(54) METHOD AND CIRCUIT USING BOUNDARY SCAN CELLS FOR DESIGN LIBRARY ANALYSIS

(75) Inventors: Pamela S. Gillis, Jericho, VT (US); David D. Litten, Jericho, VT (US); Steven F. Oakland, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 10/906,481

(22) Filed: Feb. 22, 2005

(65) Prior Publication Data

US 2006/0190784 A1 Aug. 24, 2006

(51) Int. Cl.
*G01R 31/28* (2006.01)

(52) U.S. Cl. ............... 714/726; 714/30; 714/734; 714/745; 702/75; 702/106; 716/6

(58) Field of Classification Search ............... None
See application file for complete search history.

(56) References Cited

U.S. PATENT DOCUMENTS

| | | | |
|---|---|---|---|
| 5,386,423 A | 1/1995 | Koo et al. | |
| 5,530,706 A | 6/1996 | Josephson et al. | |
| 5,768,289 A * | 6/1998 | James | 714/727 |
| 5,774,473 A | 6/1998 | Harley | |
| 5,796,751 A * | 8/1998 | Kundu | 714/726 |
| 5,920,575 A * | 7/1999 | Gregor et al. | 714/726 |
| 6,195,775 B1 | 2/2001 | Douskey et al. | |
| 6,314,539 B1 * | 11/2001 | Jacobson et al. | 714/727 |
| 6,348,825 B1 | 2/2002 | Galbi et al. | |
| 6,539,510 B1 | 3/2003 | St. Pierre, Jr. et al. | |
| 6,567,943 B1 * | 5/2003 | Barnhart et al. | 714/727 |
| 6,578,168 B1 | 6/2003 | Parulkar et al. | |
| 6,678,848 B1 | 1/2004 | Chan | |
| 6,949,946 B1 * | 9/2005 | Dahn | 326/16 |
| 7,020,819 B2 * | 3/2006 | Shin | 714/727 |
| 7,069,486 B2 * | 6/2006 | Nagamine et al. | 714/729 |
| 2002/0116674 A1 * | 8/2002 | Schmid | 714/724 |

OTHER PUBLICATIONS

Rizzolo et al., "System Performance Management for S/390 Parallel Enterprise Server G5", IBM Journal, vol. 43 No. 5/6, Nov. 1999, pp. 651-660.*

Aipperspach et al.; Method to Allow Variable Scan Chain Lengths for Register Arrays; IBM Technical Disclosure Bulletin; vol. 40; No. 07; Jul. 1997; pp. 71-72.

* cited by examiner

*Primary Examiner*—Jacques Louis-Jacques
*Assistant Examiner*—John P. Trimmings
(74) *Attorney, Agent, or Firm*—Schmeiser, Olsen & Watts; Michael J. LeStrange

(57) ABSTRACT

A boundary scan register circuit and a method of characterization testing. The boundary scan register circuit, including: a multiplicity of boundary scan cells connected in series, each boundary scan cell having a latch; means for isolating the boundary scan cells into one or more boundary scan segments, each boundary scan segment containing a different set of the boundary scan cells; and means for characterizing signal propagation through each boundary scan segment.

20 Claims, 6 Drawing Sheets

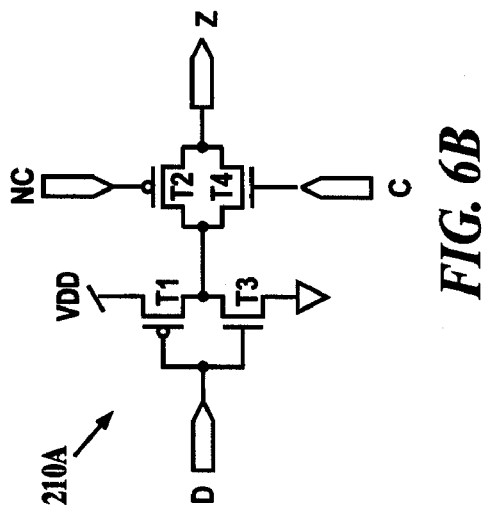
FIG. 6A
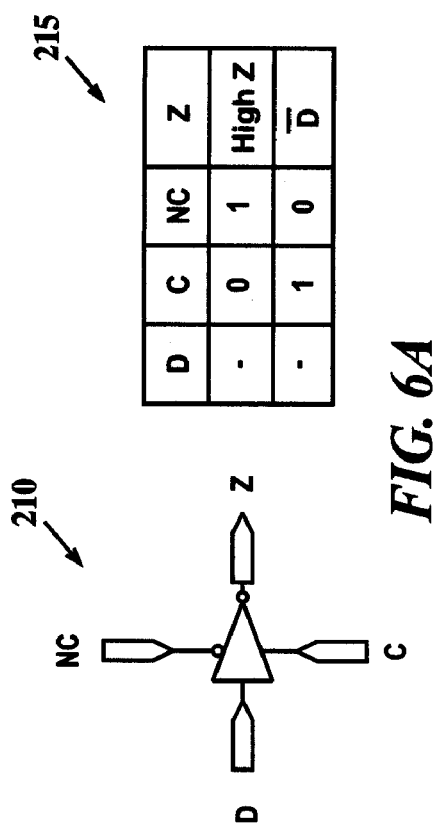
FIG. 6A (210)
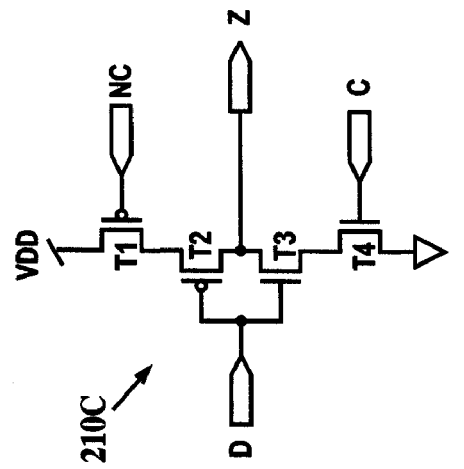
FIG. 6B
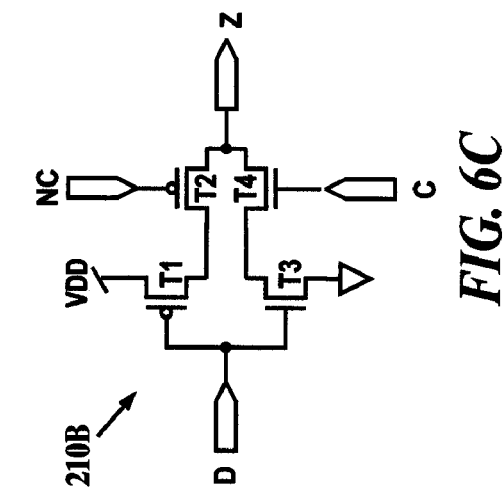
FIG. 6C
FIG. 6D

METHOD AND CIRCUIT USING BOUNDARY SCAN CELLS FOR DESIGN LIBRARY ANALYSIS

FIELD OF THE INVENTION

The present invention relates to the field of boundary scan testing; more specifically, it relates to a method and circuit characterization of process technology libraries and circuit implementations of latches using boundary scan registers.

BACKGROUND OF THE INVENTION

In limited volume production such as that found in the application specific integrated circuit (ASIC) realm, potential design improvements are difficult to assess because of the low volumes. While there are many techniques for testing integrated chips, current testing methodology provides little information useful to the designer of integrated circuits in terms of determining the effects of different process technology device library elements or different latch circuit implementations on integrated circuit performance. Evaluations can be performed using test chips. However test chips are expensive to design and fabricate and cannot normally be run in sufficient volume in limited volume production scenarios such as found in the ASIC realm.

Therefore, there is a need for an inexpensive methodology for characterization of process technology device library elements and latch circuits.

SUMMARY OF THE INVENTION

The present invention modifies boundary scan registers used to test interconnections of integrated circuit chips to allow process technology device library and latch circuit implementation performance characterization. Both intra (same process technology) and inter (different process technology) library elements may be characterized. The modification of boundary scan registers is done by substitution of different latch types of the same function (such different types of D-flip flops, i.e. a different circuit implementation) or by replacement of devices or groups of devices (such as transistors within a D flip-flop, i.e. having a different parametric specification) of otherwise identical latches of the boundary scan cells in different segments of the boundary scan register. The specific latch circuit implementation and process technology device library to be used in each boundary scan cell of each boundary scan segment is selected during design of the integrated circuit chip.

A first aspect of the present invention is a boundary scan register circuit, comprising: a multiplicity of boundary scan cells connected in series, each boundary scan cell having a latch; means for isolating the boundary scan cells into one or more boundary scan segments, each boundary scan segment containing a different set of the boundary scan cells; and means for characterizing signal propagation through each boundary scan segment.

A second aspect of the present invention is a method of characterizing elements of a boundary scan cell, comprising: providing a multiplicity of boundary scan cells connected in series, each boundary scan cell having a latch; isolating the boundary scan cells into one or more boundary scan segments, each boundary scan segment containing a different set of the boundary scan cells; and characterizing signal propagation through each the boundary scan segment.

A third aspect of the present invention is a method of characterizing elements of a boundary scan cell of a boundary scan register used for testing interconnections of an integrated circuit chip, comprising: providing a set of boundary scan cells connected in series to form a boundary scan register, a test data output pin of each previous boundary scan cell of the boundary scan register coupled to a test data input pin of an immediately subsequent boundary scan cell of the boundary scan register, each boundary scan cell coupled between a different integrated circuit chip input/output pad and a corresponding core logic circuit pin of the core logic circuit, each boundary scan cell having a latch, each latch having a latch mode and a flush mode; isolating the boundary scan cells into one or more boundary scan segments, each boundary scan segment containing a different sub-set of the set of boundary scan cells; and characterizing signal propagation through each the boundary scan segment.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 6A is a logical description of FIGS. 6B, 6C and 6D, which are exemplary implementations of the gated inverters of FIG. 5.

DETAILED DESCRIPTION OF THE INVENTION

References to IEEE 1149.1 standards are to the Institute of Electrical and Electronic Engineers) IEEE standard 1149.1 which is defined by the Standard Test Access Port and Boundary Scan Architecture, Institute of Electrical and Electronics Engineers (May 21, 1990) and the 1149.1b-1994 Supplement.

For the purposes of the present invention a flip-flop is a type of latch, a pad is a physical chip structure for connecting the integrated circuit chip to the outside world and a pin is an internal chip connection point between circuits within an integrated circuit chip. The terms nominal design threshold voltage, nominal gate dielectric thickness and nominal channel length indicates a voltage, thickness or length specified for a device from a particular process technology library to meet a pre-determined device (i.e. transistor) performance specification. A latch circuit implementation is a function of the selection and interconnection of transistors, logic gates and other circuit elements used in the latch circuit and is independent of the process technology device library those circuit elements are selected from.

Boundary scan registers are used to test interconnections of integrated circuit chips to higher level packaging and between integrated circuit chips. During interconnect testing, boundary scan registers allow test patterns from a tester to be loaded into latches, be driven and from output drivers of each integrated circuit chip to receiver circuits of connected integrated circuit chips and the resultant output response captured in latches. The resultant data patterns are then compared by the tester to expected patterns. During interconnect testing, latches in boundary scan registers are connected to off-chip drivers, and paths from the core logic circuits to the off-chip drivers are disabled. During normal operation of the integrated circuit, the latches in the boundary scan registers are disconnected from the off-chip drivers, and paths from the core logic circuits to the off-chip drivers are enabled.

Since boundary scan testing is done at speeds well below normal operating speeds of the core logic circuits being tested and because in normal integrated circuit operation the boundary scan registers are not in the chip pad to core logic circuit pin path, the integrated circuit designer can select from a wide range of latch circuit implementations and process technology devices to use in designing a boundary scan chain.

Figure 1:
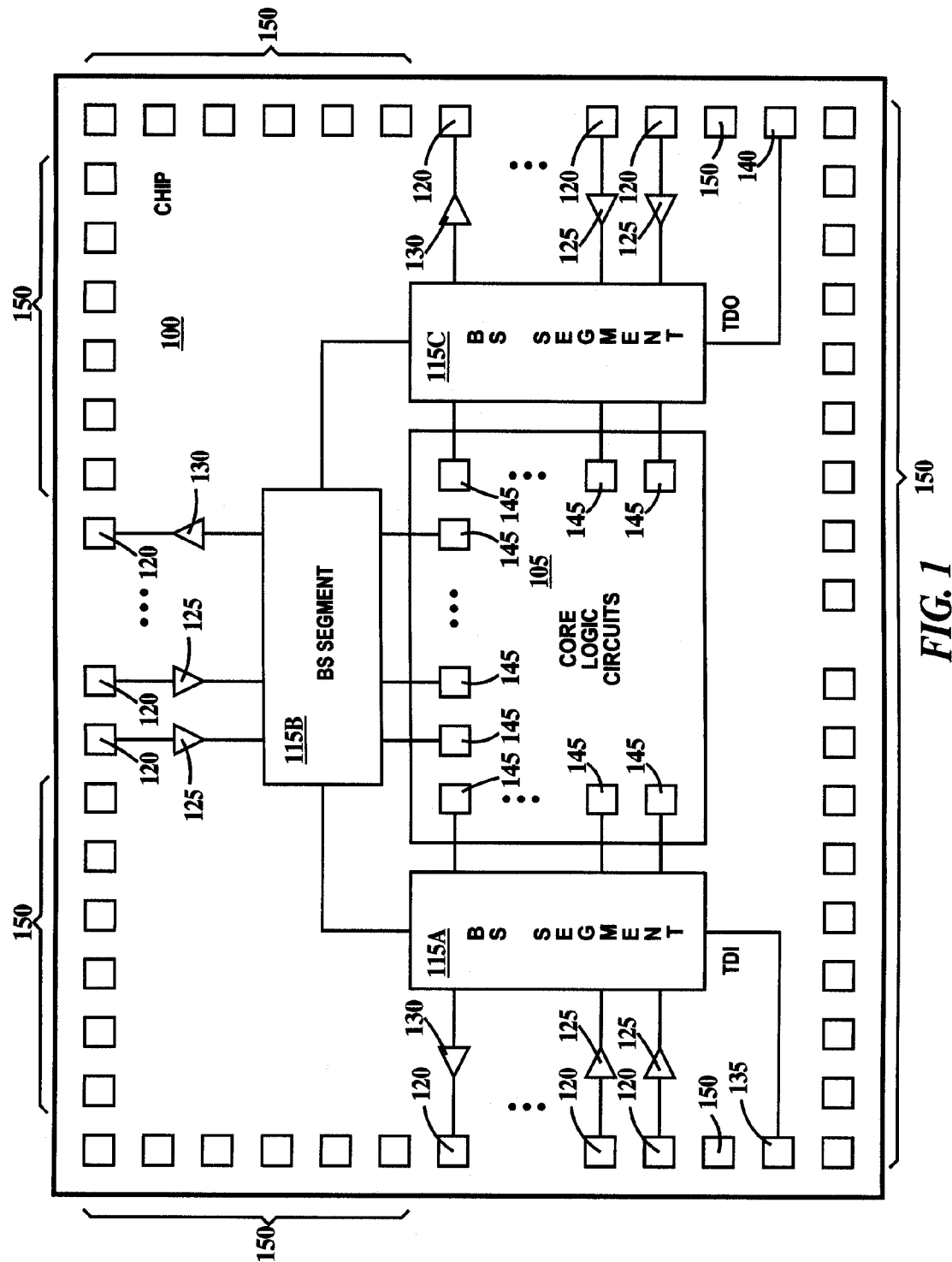
FIG. 1 is a schematic circuit diagram of an integrated circuit according to the present invention.

FIG. 1 is a schematic circuit diagram of an integrated circuit according to the present invention. In FIG. 1, an integrated circuit 100 includes a core logic circuit 105 and boundary scan segments 115A, 115B and 115C. While three boundary scan segments (115A, 115B and 115C) are illustrated in FIG. 1, one or more boundary scan segments may be used to practice the present invention. Each boundary scan segment 115A, 115B and 115C is coupled to one or more chip input/output (I/O) pads 120 through either a receiver 125 or a driver 130. For bi-directional chip I/O pads, both a receiver and a driver would be coupled between the chip I/O pad and the boundary scan segment. A test data input (TDI) chip pad 135, boundary scan segment 115A, boundary scan segment 115B, boundary scan segment 115C and a test data output (TDO) chip pad 140 are coupled in series. Each boundary scan segment 115A, 115B and 115C is connected to one or more core logic circuit I/O pins 145. Integrated circuit chip 100 includes a multiplicity of additional chip pads 150 that may be used for supplying power to the integrated circuit chip or for connecting analog signals to the integrated circuit chip.

Figure 2:
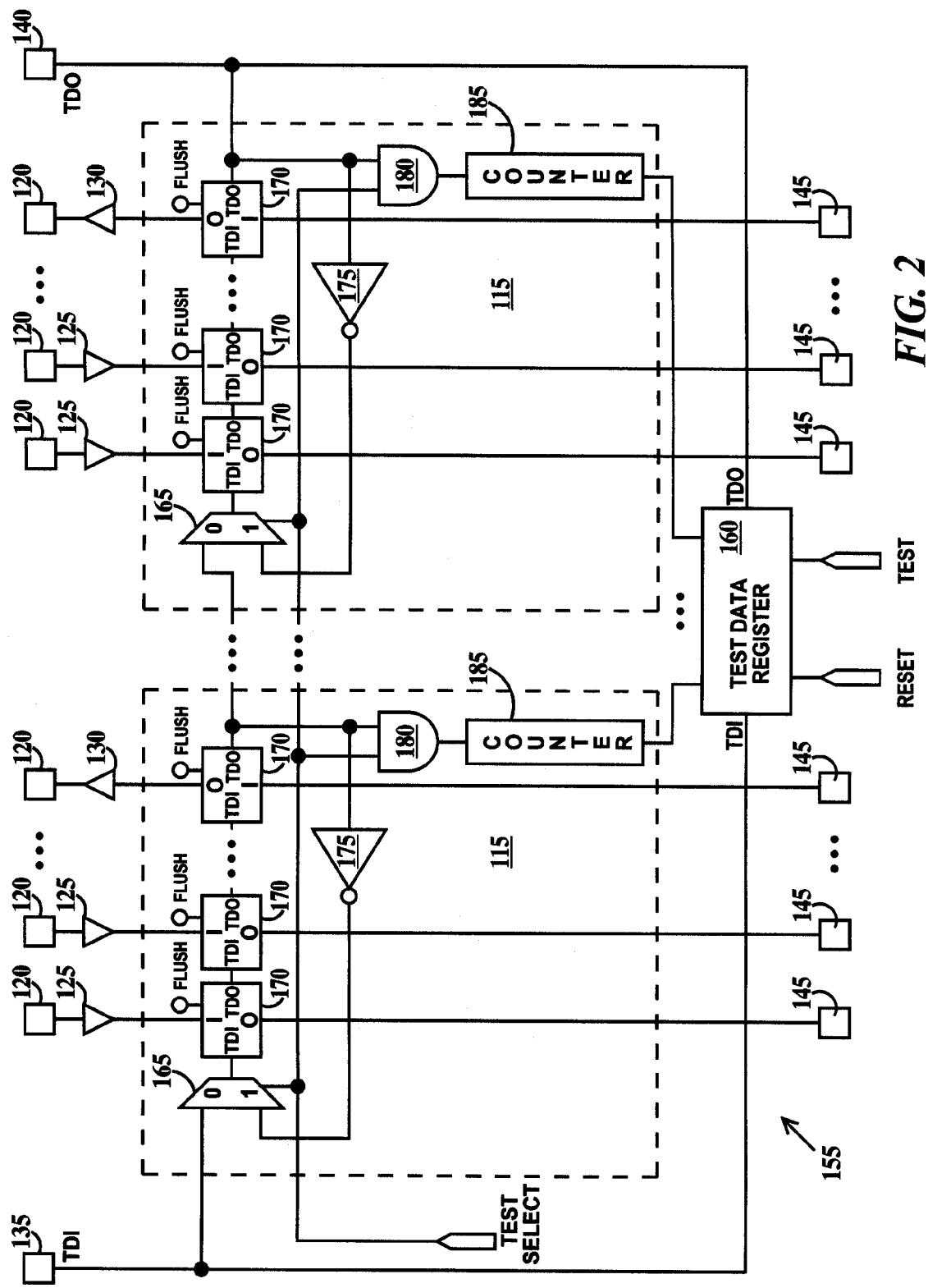
FIG. 2 is a schematic circuit diagram of boundary scan segments according to the present invention.
Figure 3:
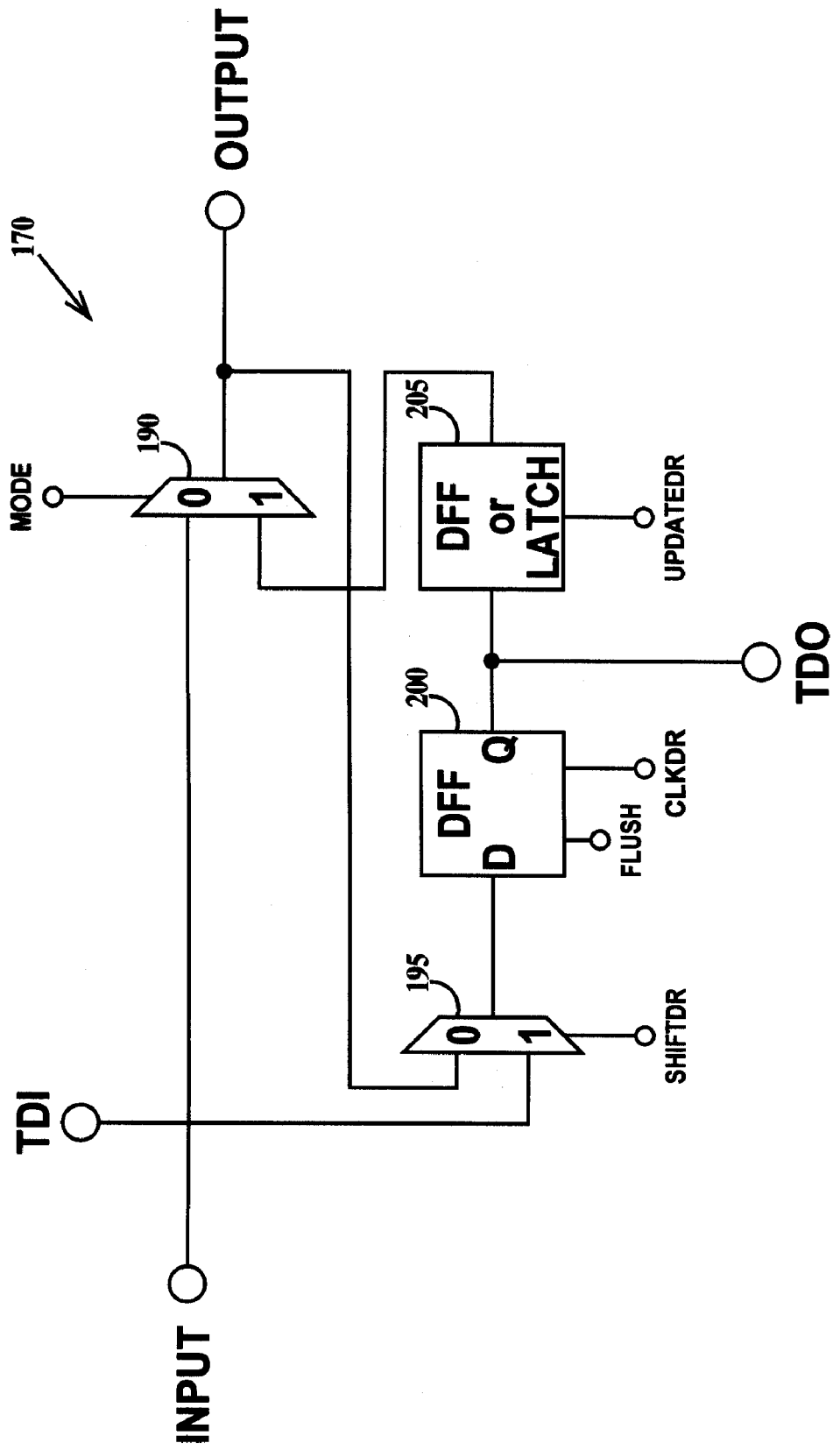
FIG. 3 is an exemplary boundary scan cell schematic circuit diagram according to the present invention.
Figure 4:
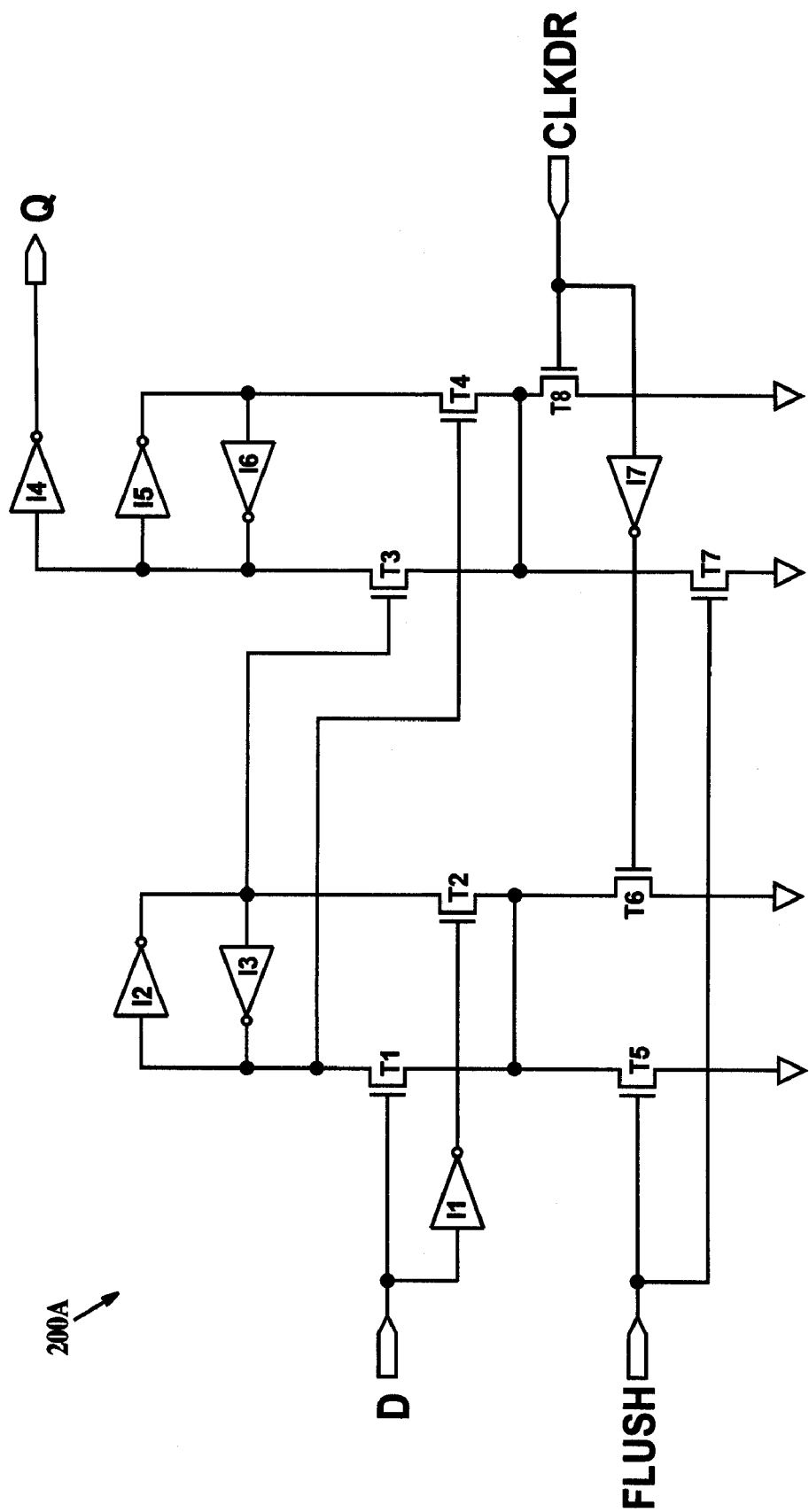
FIG. 4 is a first exemplary flushable D-flip flop according to the present invention.
Figure 5:
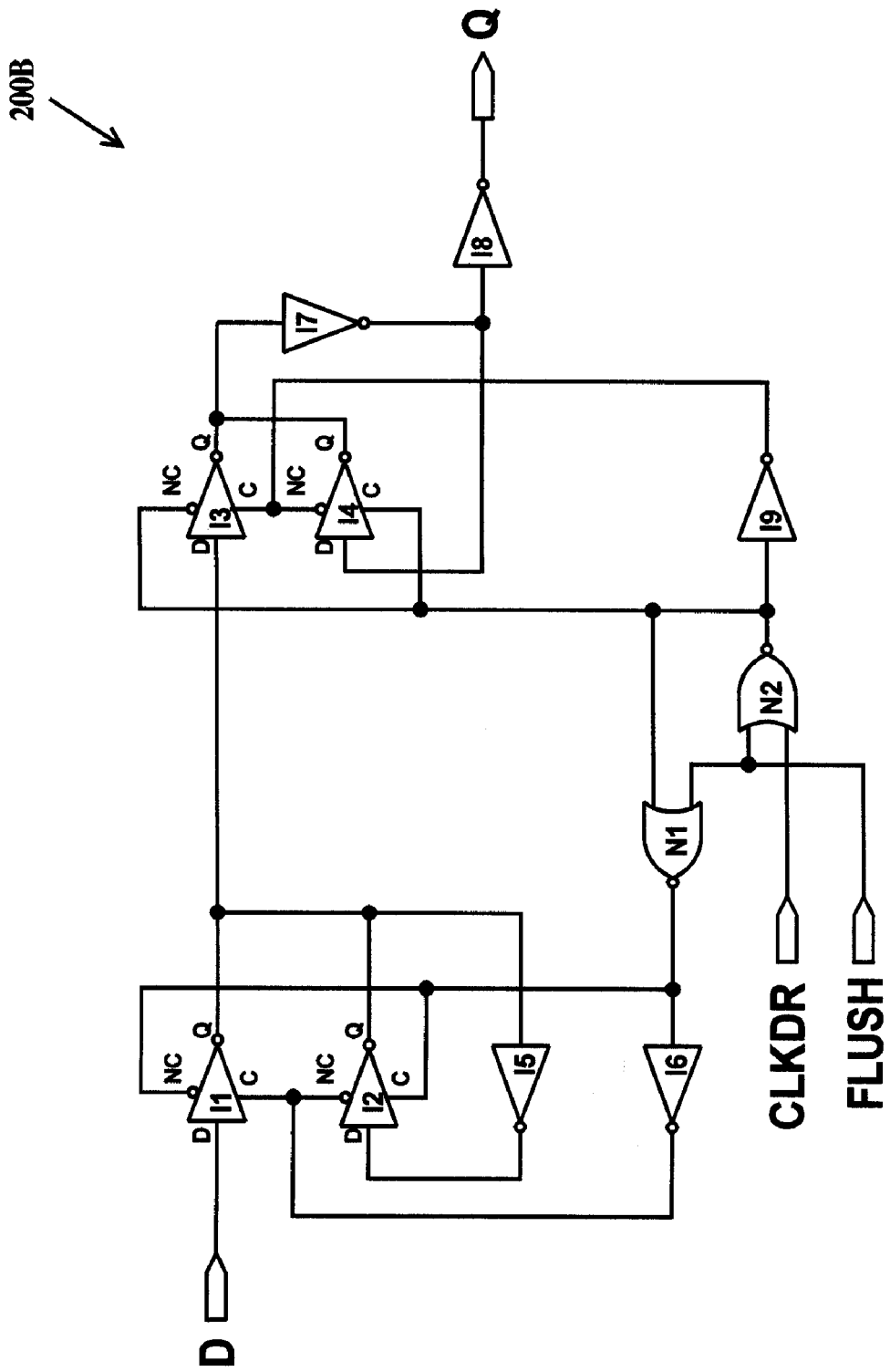
FIG. 5 is a second exemplary flushable D-flip flop according to the present invention.

FIG. 2 is a schematic circuit diagram of a boundary scan register according to the present invention. In FIG. 2, a boundary scan register 155 includes one or more boundary scan segments 115 coupled in series and a test data register 160. Each boundary scan segment 115, includes a multiplexer (MUX) 165, one or more boundary scan cells 170 coupled in series, an inverter 175, an AND gate 180 and a counter 185. Boundary scan cells 170 utilize D flip-flops having a flush mode as illustrated in FIGS. 3, 4 and 5 and described infra and as taught in U.S. Pat. No. 6,567,943 to Barnhart et al. which is hereby incorporated by reference in its entirety. Other types of flushable latches may be used as well.

For each boundary scan segment 115, the output of MUX 165 is connected to the TDI pin of a first of boundary scan cells 170. A TDO pin of each boundary scan cell 170 is connected to the TDI pin of the next immediate boundary scan cell 170. The TDO pin of a last boundary scan cell is connected to a first input of AND gate 180, the input to inverter 175 and either the first input of MUX 165 of the next immediate boundary scan segment or (in the case of a last boundary scan segment) to TDO chip pad 140. Thus, each boundary scan cell 170 of each boundary scan segment 115 is connected in series and each boundary scan segment 115 is connected in series between TDI chip pad 135 and TDO chip pad 140. MUXes 165 allow isolation of each boundary scan segment 115. The output of inverter 175 is connected to a second input of MUX 165. A TEST SELECT pin is connected to the MUX select pin of each MUX 165 and a second input of each AND gate 180. The output of AND gate 180 is connected to an input of a counter 185, and an output of each counter 185 is connected to a different input of test data register 160. An input (I) of each boundary scan cell 170 is coupled either to an I/O chip pad 120 through a receiver 125 or to a core logic circuit pin 145. An output (O) of each boundary scan cell 170 is coupled either to a core logic circuit I/O pin 145 or to an I/O chip pad 120 through a driver 130.

TDI chip pad 135 is connected to MUX 165 of a first of boundary scan segments 115 and to TDI pin of test data register 160. TDO chip pad 140 is connected to a last of boundary scan cells 170 of a last of boundary scan segments 115 and to a TDO pin of test data register 160. Test data register may include other inputs such as a RESET pin and a TEST pin.

For normal operation, component testing according to IEEE 1149.1 INTEST standards BS Shift operation BS Update Operation and for boundary scan interconnect testing according to IEEE 1149.1 Standard EXTEST, the TEST SELECT pin is held low. During boundary scan interconnect testing, a low signal on the TEST SELECT pin allows data on TDI chip pad 135 to serially propagate through all boundary scan cells 170 in all boundary scan segments 115. Test data on chip I/O pads 120 connected to receivers 125 can then be captured in latches in boundary scan cells 170 and test data in the latches in boundary scan cells 170 controls drivers 130 connected to chip I/O pads 120. A low signal on TEST SELECT disables output from all AND gates 180.

For process technology device library characterization, latches in boundary scan cells 170 are set to flush mode (described infra) and a high on the TEST SELECT pin allows data on the TDO pin of the last boundary scan cell 170 of each boundary scan segment 115 to propagate through respective inverters 175 back to the TDI pin of the first boundary scan cell 170 of each boundary scan segment 115. A high signal on TEST SELECT enables output from all AND gates 180. Thus, each boundary scan segment 115 is configured as an oscillator. As each boundary scan segment 115 oscillates, corresponding counters 185 increment on each cycle. Counters 185 of faster oscillating boundary scan segments 115 will count higher in a given period of time. After a selected period of time has elapsed, the count of each counter 185 is captured in test data register 160. The data in test data register is then accessed through TDO chip pad 140.

Since the oscillation frequency is dependent upon delays through latches in the data path in each boundary scan cell 170 and delays through individual devices in the data path in each latch, performance testing of specific latch circuit implementations and specific process technology devices can be accomplished. In one example, all boundary scan latches in the data path in all boundary scan cells 170 of a given boundary scan segment 115 may be the same, but the specific latch circuit implementation used in each boundary scan segment may be a different. In a second example, all the latches in all boundary scan cells 170 of all boundary scan segments 115 may be the same circuit implementation but the process technology of selected transistors in the data path in the boundary scan latches of different boundary scan segments may be different.

Boundary scan register 155 uses a single test instruction (TEST SELECT signal) to characterize all boundary scan segments 170. However, boundary scan register 155 can be modified to use individual test instructions for each boundary scan segment. Additionally, boundary scan register 155 can be modified to use a single counter 185 for all boundary scan segments 115 and a smaller test data register 160.

FIG. 3 is an exemplary boundary scan cell schematic circuit diagram according to the present invention. In FIG. 3, boundary scan cell 170 includes a first MUX 190 whose select pin is connected to a MODE pin, a second MUX 195 whose select pin is connected to a SHIFTDR pin, a first latch 200 responsive to a flush signal on a FLUSH pin and a clock signal on a CLKDR pin, a second latch 205 responsive to an update signal on an UPDATEDR pin and INPUT, OUTPUT, TDI, and TDO pins as described supra. In one example, first latch 200 is a flushable D flip-flop and second latch 205 is a D flip-flop or any suitable latch. A D flip-flop is a latch that stores the value on its data (D) input pin whenever its clock input makes a pre-defined transition (i.e. low to high or high to low) and whose data output (O) pin shows the value of the currently stored data. A first input of MUX 190 is connected to the INPUT pin and the output of first MUX 190 is connected to the OUTPUT pin and a first input of second MUX 195. The TDI pin is connected to a second input of second MUX 195. An output of MUX 195 is connected to the D pin of latch 200 and the Q pin of latch 200 is connected to the D input of latch 205 and the TDO pin. The Q pin of latch 205 is connected to a second input of MUX 190.

For normal operating mode, the MODE pin held low, the flush signal on the FLUSH pin set to off and the TEST SELECT pin of FIG. 2 held low, boundary scan cell 170 is in normal core logic circuit operating mode and data is passed from the INPUT pin through first MUX 190 to the OUTPUT pin. The signal on the SHIFTDR pin may be high or low.

As described supra, there are two test modes, boundary scan interconnect test mode and process technology device library characterization mode. For boundary scan interconnect testing, the flush signal on the FLUSH pin is set to off, the test select signal is set to boundary scan interconnect test (the TEST SELECT pin of FIG. 2 is held low) and the SHIFTDR pin is held low. For cells connected to output drivers 130 (see FIG. 2) the MODE pin is held high. The activated data paths of boundary scan cell 170 are latch 205 to MUX 190 to the OUTPUT pin and to MUX 195 to Latch 200. For cells connected to input receivers 125 (see FIG. 2) the MODE pin is held low. The activated data paths of boundary scan cell 170 are INPUT to MUX 190 to the OUTPUT pin and to MUX 195 to latch 200.

Core logic testing is not affected by the present invention. The TEST SELECT pin of FIG. 2 is set to low and the flush signal on the FLUSH pin is set to off. The chip can then be tested using the IEEE 1149.1 INTEST standard or by other means.

For process technology device library characterization, the flush signal is set to on, the test select signal is set to characterization test (high on TEST SELECT pin of FIG. 2) and the SHIFTDR pin is held high. With flush mode activated, data at the D pin of latch 200 is immediately propagated (flushed) to the Q pin. The data path in design library characterization is from the TDI pin, through second MUX 195, first latch 200, to the TDO pin.

We will now turn to some examples of process technology device library characterization. Two different latch circuit designs will be illustrated and two different methods of modifying the latches will be illustrated.

FIG. 4 is a first exemplary flushable D-flip flop according to the present invention. In FIG. 4 a latch 200A includes NFETs T1, T2, T3, T4, T5, T6, T7 and T8 and inverters I1, I2, I3, I4, I5, I6 and I7. Latch 200A is a D flip-flop. With a high on the FLUSH pin, data is propagated (flushed) from the D input pin to the Q output pin. The data path in latch 200A is from the D pin, serially through NFETs T1, T2, T3 and T4, and inverters I1, I2, I3, I5, I6 and I4 to output pin Q. In one example, each boundary scan cell 170 of each boundary scan segment 115 (see FIG. 2) uses latch 200A in place of latch 200 of FIG. 3, however, one or more of NFETs T1, T2, T3 and T4 are selected from different process technology device libraries for the boundary scan cell latches of each boundary scan segment. In one example, all the boundary scan cells in boundary scan segments 115A, 115B and 115C of FIG. 1 use latch 200A, but one or more of NFETs T1, T2, T3 and T4 in boundary scan cells of boundary scan segment 115A (see FIG. 1) is different from the corresponding NFET T1, T2, T3 or T4 in boundary scan cells of boundary scan segments 115B (see FIG. 1) and 115C (see FIG. 1). Additionally, one or more of NFETs T1, T2, T3 and T4 in boundary scan cells of boundary scan segment 115B (see FIG. 1) is different from the corresponding NFET T1, T2, T3 or T4 in boundary scan segments 115A (see FIG. 1) and 115C (see FIG. 1). Thus, the performance (transistor switching speed) of different process technology transistors can be compared.

Examples of different process technology device libraries include libraries wherein transistors of each library have different threshold voltages, different gate dielectric thickness or different channel length. Examples of different threshold voltages include nominal design threshold voltage, low (i.e. sub-nominal) threshold voltage and high threshold (i.e. super-nominal) voltage. Examples of different gate dielectric thickness include nominal design gate dielectric thickness, thin (i.e. sub-nominal) gate dielectric thickness and thick (i.e. super-nominal) gate dielectric thickness. Examples of different channel lengths include nominal design channel length, short (i.e. sub-nominal) channel length, and long (i.e. super-nominal) channel length.

It should be noted that some process technology device libraries may include combinations of different parameters found in two or more process device technology libraries. In a first example a transistor may have a nominal gate dielectric thickness, a nominal channel length and a nominal threshold voltage. In a second example, a transistor may have a nominal gate dielectric thickness, a nominal channel length and a low threshold voltage. In a third example a transistor may have a nominal gate dielectric thickness, a short channel length and a low threshold voltage. In fourth example, a transistor may have a thin or thick gate dielectric thickness, a nominal channel length and a low or high threshold voltage. In the most general example, a transistor may have a nominal, thin or thick gate dielectric thickness; a nominal, short or long channel length; and a nominal, low or high threshold voltage. The salient point is that there is at least one difference between devices (i.e. transistors) in latches of boundary scan cells in different boundary scan segments.

FIG. 5 is a second exemplary flushable D-flip flop according to the present invention. In FIG. 5 a latch 200B includes gated inverters I1, I2, I3 and I4, inverters I5, I6, I7, I8 and I9, and NOR gates N1 and N2. Latch 200B is a D flip-flop. With a high on the FLUSH pin, data is propagated (flushed) from the D input pin to the Q output pin. The data path in latch 200B is from the D pin, serially through gated inverter I1, gated inverter I3, inverter I7 and inverter I8 to output pin Q. In one example, each boundary scan cell 170 of each boundary scan segment 115 (see FIG. 2) uses a latch 200B in place of latch 200 of FIG. 3, however, one or both of gated inverters are selected from identical function, but different inverter circuit implementations from the same process technology device library for the boundary scan cell latches of each boundary scan segment.

Examples of different gated inverter circuit implementations are illustrated in FIGS. 6A through 6D. FIG. 6A is a logical description of and FIGS. 6B, 6C and 6D are exemplary implementations of gated inverters I1 and I3 of FIG. 5. In FIG. 6A, a gated inverter 210 has a data input pin D, a data output pin Z and complementary control pins C and NC. Logic table 215 illustrates that with a low signal on pin C and a high signal on pin NC, pin Z will be in a high-impedance (High Z) state and that with a high signal on pin C and a low signal on pin NC, an inverted D signal will appear on output pin Z.

In FIG. 6B, a gated inverter 210A includes PFETs T1 and T2 and NFETS T3 and T4. In FIG. 6B, input pin D is connected to the gates of PFET T1 and NFET T3. The source of PFET T1 is connected to VDD and the source of NFET T3 is connected to ground. The gate of PFET T2 is connected to pin NC and the gate of NFET T4 is connected to pin C. The drains of PFET T1 and NFET T3 are connected to the sources of PFET T2 and NFET T4. The drains of PFET T2 and NFET T4 are connected to pin Z.

In FIG. 6C, a gated inverter 210B includes PFETs T1 and T2 and NFETS T3 and T4. Input pin D is connected to the gates of PFET T1 and NFET T3. The source of PFET T1 is connected to VDD and the source of NFET T3 is connected to ground. The gate of PFET T2 is connected to pin NC and the gate of NFET T4 is connected to pin C. The source of PFET T2 is connected to the drain of PFET T1 and the source of NFET T4 is connected to the drain of NFET T3. The drains of PFET T2 and NFET T4 are connected to pin Z.

In FIG. 6D, a gated inverter 210C includes PFETs T1 and T2 and NFETS T3 and T4. Input pin D is connected to the gates of PFET T2 and NFET T3. The source of PFET T2 is connected to the drain of PFET T1 and the source of PFET T1 is connected to VDD. The source of NFET T3 is connected to the drain of NFET T4 and the source of NFET T4 is connected to ground. The gate of PFET T1 is connected to pin NC and the gate of NFET T4 is connected to pin C. The drains of PFET T2 and NFET T3 are connected to pin Z.

Returning to FIG. 5, in one example, all the boundary scan cells in boundary scan segments 115A, 115B and 115C of FIG. 1 use latch 200B, but one or both of gated inverters I1 and I3 in boundary scan cells of boundary scan segment 115A (see FIG. 1) is a gated inverter 210A, one or both of gated inverters I1 and I3 in boundary scan cells of boundary scan segment 115B (see FIG. 1) is a gated inverter 210B and one or both of gated inverters I1 and I3 in boundary scan cells of boundary scan segment 115C (see FIG. 1) is a gated inverter 210C. Thus, the performance (signal propagation speed) of different circuit implementation of gated inverters can be compared.

Other examples of circuit implementations that may be characterized according to the present invention include AND gates, OR gates, NAND gates, NOR gates and logical combinations thereof, including combinations including inverters and gated inverters.

It is also possible, according to the present invention to utilize simply different latches in each boundary scan segment. For example, each boundary scan cell in boundary scan segment 115A of FIG. 1 may use latch 200A of FIG. 4 while each boundary scan cell in boundary scan segment 115B of FIG. 1 may use latch 200B of FIG. 5. Additionally each boundary scan cell in boundary scan segment 115C of FIG. 1 may use a latch different from latch 200A of FIG. 4 or latch 200B of FIG. 5. Thus, the performance (signal propagation speed) of different latch implementations can be compared.

It is also within the scope of the present invention that the combinations of one or more segments using different latch circuit implementations may be used with one or more segments using devices in the latches selected from different process technology device libraries.

Boundary scan register 155 and boundary scan cells 170 have been illustrated in an IEEE 1149.1 standard implementation. However, the present invention may be modified for use with other scan implementations such as Level Sensitive Scan Design (LSSD) or MUX scan.

Thus, the present invention provides an inexpensive methodology for characterization of process technology device library elements and latch circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A boundary scan register circuit, comprising:
a multiplicity of boundary scan cells connected in series, each boundary scan cell having a latch;
means for isolating said boundary scan cells into two or more boundary scan segments, each boundary scan segment containing a different set of said boundary scan cells; and
means for characterizing signal propagation speed through each said boundary scan segment.

2. A boundary scan register circuit, comprising:
a multiplicity of boundary scan cells connected in series, each boundary scan cell having a latch;
means for isolating said boundary scan cells into one or more boundary scan segments, each boundary scan segment containing a different set of said boundary scan cells; and
means for characterizing signal propagation through each said boundary scan segment, said means for characterizing signal propagation through each said boundary scan segment including a corresponding oscillator circuit comprising each said latch in each said boundary scan segment.

3. The boundary scan register circuit of claim 2, wherein said latch is a flushable latch.

4. The boundary scan register circuit of claim 2, wherein said latch is a flushable D flip-flop.

5. The boundary scan register circuit of claim 2, wherein a circuit implementation of said latch in each boundary scan cell of a first boundary scan segment is different from a corresponding circuit implementation of said latch in each boundary scan cell of a second boundary scan segment.

6. The boundary scan register circuit of claim 2, wherein said latch in each boundary scan cell of a first boundary scan segment includes devices selected from a first process technology device library and said latch in each boundary scan cell of a second boundary scan segment includes devices selected from a second and different process technology device library.

7. The boundary scan register circuit of claim 6, wherein said first and second process technology device libraries include elements dependently selected from the group consisting of transistors having nominal design threshold voltages, sub-nominal design threshold voltages, super-nominal design threshold voltages, nominal design gate dielectric thickness, sub-nominal design gate dielectric thickness, super-nominal design gate dielectric thickness, nominal design channel length, sub-nominal design channel length and super-nominal design channel length.

8. The boundary scan register circuit of claim 2, wherein:
said means for characterizing signal propagation through each said boundary scan segment further includes a corresponding cycle counter coupled to each said oscillator circuit; and
said means for isolating said boundary scan cells into one or more boundary scan segments includes a corresponding multiplexer in each boundary scan segment, a first input of each multiplexer coupled to a test data input pad or a test data output pin of a last boundary scan cell of an immediately previous boundary scan segment, a second input of said multiplexer coupled to a test data output pin of a corresponding last boundary scan cell of each boundary scan segment and an output of said multiplexer coupled to a test data input pin of a corresponding first boundary scan latch of each boundary scan segment.

9. A method of characterizing elements of a boundary scan cell, comprising:
providing a multiplicity of boundary scan cells connected in series, each boundary scan cell having a latch;
isolating said boundary scan cells into two or more boundary scan segments, each boundary scan segment containing a different set of said boundary scan cells; and
characterizing signal propagation speed through each said boundary scan segment.

10. A method of characterizing elements of a boundary scan cell, comprising:
providing a multiplicity of boundary scan cells connected in series, each boundary scan cell having a latch;
isolating said boundary scan cells into one or more boundary scan segments, each boundary scan segment containing a different set of said boundary scan cells; and
characterizing signal propagation through each said boundary scan segment, said characterizing signal propagation through each said boundary scan segment including providing a corresponding oscillator circuit comprising each said latch in each said boundary scan segment.

11. The method of characterizing of claim 10, wherein said latch is a flushable latch.

12. The method of characterizing of claim 10, wherein said latch is a flushable D flip-flop.

13. The method of characterizing of claim 10, wherein a circuit implementation of said latch in each boundary scan cell of a first boundary scan segment is different from a corresponding circuit implementation of said latch in each boundary scan cell of a second boundary scan segment.

14. The method of characterizing of claim 10, wherein said latch in each boundary scan cell of a first boundary scan segment includes devices selected from a first process technology device library and said latch in each boundary scan cell of a second boundary scan segment includes devices selected from a second and different process technology device library.

15. The method of characterizing of claim 14, wherein said first and second process technology device libraries include elements dependently selected from the group consisting of transistors having nominal design threshold voltages, sub-nominal design threshold voltages, super-nominal design threshold voltages, nominal design gate dielectric thickness, sub-nominal design gate dielectric thickness, super-nominal design gate dielectric thickness, nominal design channel length, sub-nominal design channel length and super-nominal design channel length.

16. The method of characterizing of claim 10, wherein:
characterizing signal propagation through each said boundary scan segment further includes providing a corresponding cycle counter coupled to each said oscillator circuit; and
isolating said boundary scan cells into one or more boundary scan segments includes providing a corresponding multiplexer in each boundary scan segment, a first input of each multiplexer coupled to a test data input pad or a test data output pin of a last boundary scan cell of an immediately previous boundary scan segment, a second input of said multiplexer coupled to a test data output pin of a corresponding last boundary scan cell of each boundary scan segment and an output of said multiplexer coupled to a test data input pin of a corresponding first boundary scan latch of each boundary scan segment.

17. A method of characterizing elements of a boundary scan cell of a boundary scan register used for testing interconnections of an integrated circuit chip, comprising:
providing a set of boundary scan cells connected in series to form said boundary scan register, a test data output pin of each previous boundary scan cell of said boundary scan register coupled to a test data input pin of an immediately subsequent boundary scan cell of said boundary scan register, each boundary scan cell coupled between a different integrated circuit chip input/output pad and a corresponding core logic circuit pin of said core logic circuit, each boundary scan cell having a latch, each said latch having a latch mode and a flush mode;
isolating said boundary scan cells into two or more boundary scan segments, each boundary scan segment containing a different sub-set of said set of boundary scan cells; and
characterizing signal propagation through each said boundary scan segment.

18. The method of claim 17, further including, in a normal operating mode of said integrated circuit chip:
for each boundary scan cell, coupling corresponding integrated circuit chip input/output pads to corresponding core logic circuit pins without passing through said latch of said boundary scan cell.

19. The method of claim 17, further including, in a process technology device library characterization mode of said integrated circuit chip:
for each boundary scan segment, coupling said latch of each said boundary scan cell between a corresponding test data input pin and a corresponding test data output pin;
for each boundary scan segment, coupling a test data input of a first boundary scan cell to a test data output pin of a last boundary scan cell; and
setting each said latch to flush mode.

20. The method of claim 17: wherein a circuit implementation of latches in each boundary scan cell of a first boundary scan segment of said one or more boundary scan segments is different from a corresponding circuit implementation of said latches in each boundary scan cell of a second boundary scan segment of said one or more boundary scan segments.

* * * * *